US007684203B2

(12) United States Patent
Lu et al.

(10) Patent No.: US 7,684,203 B2
(45) Date of Patent: Mar. 23, 2010

(54) MODULE WITH FIXED STRUCTURES

(75) Inventors: Yi Lu, Guangdong Province (CN); Mingzhao Zhou, Guangdong Province (CN)

(73) Assignee: Shenzhen Mindray Bio Medical Electronics Co., Ltd., Shenzhen (CN)

( * ) Notice: Subject to any disclaimer, the term of this patent is extended or adjusted under 35 U.S.C. 154(b) by 724 days.

(21) Appl. No.: 11/564,910

(22) Filed: Nov. 30, 2006

(65) Prior Publication Data

US 2007/0293078 A1 Dec. 20, 2007

(30) Foreign Application Priority Data

Jun. 16, 2006 (CN) ........................ 2006 1 0021251

(51) Int. Cl.
*H05K 5/00* (2006.01)

(52) U.S. Cl. ....................................... 361/752; 361/802

(58) Field of Classification Search ................. 361/752, 361/790, 799, 800–802, 807, 810
See application file for complete search history.

(56) References Cited

U.S. PATENT DOCUMENTS

| | | | | |
|---|---|---|---|---|
| 5,207,593 | A * | 5/1993 | Bogiel | 439/352 |
| 5,398,152 | A | 3/1995 | Borkowicz et al. | 361/119 |
| 6,618,259 | B1 | 9/2003 | Hood et al. | 361/740 |
| 6,682,361 | B2 * | 1/2004 | Zweigle | 439/347 |
| 6,717,671 | B1 | 4/2004 | Meeks et al. | 356/369 |
| 7,092,256 | B1 * | 8/2006 | Salazar et al. | 361/737 |
| 7,554,816 | B2 * | 6/2009 | Chang | 361/759 |

FOREIGN PATENT DOCUMENTS

| | | |
|---|---|---|
| CN | 2277580 | 4/1998 |
| CN | 2524393 | 12/2002 |
| CN | 1653653 | 8/2005 |
| CN | 2760811 | 2/2006 |
| WO | WO2004001909 | 12/2003 |

OTHER PUBLICATIONS

SIPO Search Report for corresponding Chinese application, 2 pages, dated Sep. 20, 2006.

* cited by examiner

*Primary Examiner*—Hung S Bui
(74) *Attorney, Agent, or Firm*—Kory D. Christensen; Stoel Rives LLP

(57) ABSTRACT

The present invention relates to a module with fixed structures, which comprises a module body, a latch and a resilient snapper mounted on the module body like a cantilever. The latch movably connected to the module body can move between the lock position and the unlock position, and on the module body is set a stop surface for preventing the latch from disengagement. The latch moves between the lock and unlock positions. When in the lock position, the latch is at least partly in the downward movement path of the free end of the resilient snapper; and when in the unlock position, the latch is out of the downward movement path of the free end of the resilient snapper. By employing a latch to control the moving space of the resilient snapper, the structure concerned is simple, and moreover only upon a toggle operation can the latch be switched between different positions. This ensures that only when the latch is unlocked, can the resilient snapper be operated in a way to enable the module to be taken out of the slot. While the latch is locked, incorrect operations are avoidable.

14 Claims, 5 Drawing Sheets

MODULE WITH FIXED STRUCTURES

STATEMENT OF THE RELATED APPLICATION

The present application claims the priority of the Chinese Patent Application No. 200610021251.3, filed on Jun. 16, 2006, entitled "Module with Fixed Structures", the disclosure of which is fully incorporated herein by reference.

FIELD OF THE INVENTION

The present invention relates to a module with fixed structures, more particularly to a module as a functional unit applied in the medical equipment, communication equipment or power supply equipment.

DESCRIPTION OF THE PRIOR ART

In order to enable the arrangement of some equipment more flexible, many modularized functional units used in the medical equipment, communication equipment and power supply equipment are generally designed as independent modules, which can be directly inserted into the slots provided in the equipment during the assembly. In this case, it is a general requirement that the operations of engaging and disengaging the modules should be definitely controllable, and that the modules should be securely mounted in the slots. In the prior art, upon insertion into the slots and pushed to the very end, the modules with fixed structures are locked to the equipment by a resilient snapper. When disengaged, it is necessary to move the resilient snapper to disengage the modules from the slots, so that the modules can be taken out therefrom. In case of such a fixed structure, the modules are taken out of the slots by operating the resilient snapper. As such, an inadvertent incorrect touch of the resilient snapper in use may remove the modules from the slots, as a result of which the modules disengage from the slots and thereby break off the communications or are smashed. In order to avoid incorrect operations, a shielding cover is added to some equipment, which entirely or partly cover the modules, while some equipment take advantage of spring screws. When the screws are screwed in, incorrect operations are avoidable; and when the screws are unscrewed, the modules can be taken out. Still some equipment use common screws to mount the modules, whereby the modules are detachable only when the screws are removed. As seen, the prior art structures intended for avoiding incorrect operations are rather complicated, and moreover unduly complicated procedures place a high demand on the spaces desired for operating the modules as well as on the spacing of the module arrays.

SUMMARY OF THE INVENTION

It is an object of the present invention to provide an improved module with fixed structures, which has a simple structure, has little demand on space for operations and is capable of preventing incorrect operations.

The present invention realizes the above object by providing a module with fixed structures comprising a module body and a resilient snapper arranged on the module body. This module is further provided with a latch movably connected with the module body, on which body a stop surface is provided for preventing the latch from disengagement. The latch can move between a lock position and an unlock position. When in the lock position, the latch at least partly stands in the downward movement path of the free end of the resilient snapper; and when in the unlock position, the latch is out of the downward movement path of the free end of the resilient snapper.

The latch and the module body form a sliding pair. The module body is provided with a guide rail, and the latch with a guide groove. The guide rail can be inserted into corresponding guide groove. The stop surface refers to the bottom surface where the guide rail engages with the guide groove, which can be used for preventing the latch from disengaging with the module body.

The latch is provided with a limiter, and the module body is provided with a first recess and a second recess which define the unlock position and the lock position respectively. The recesses are in the motion path of the limiter.

An indicia indicating the unlock and lock operations are set on the latch.

The module comprises a front housing and a back housing which fit to each other, the latch is provided on the front housing of the module, and the resilient snapper is provided on the back housing of the module.

A mounting notch is provided on the front housing of the module with two parallel guide rails extending therefrom, and a supporting panel is set beneath the guide rails.

The guide grooves are so provided on the latch that they respectively correspond to the two guide rails arranged on the front housing of the module. The guide rails can be inserted into the corresponding guide grooves.

When in the lock position or the unlock position, the latch engages with the surface of the supporting panel facing the latch.

The resilient snapper is arranged on the module body like a cantilever.

The latch is movably connected with the module body, forming a turning pair therewith, and can move between the lock position and the unlock position.

The indicia indicating the unlock and lock operations are arranged on the front housing of the module.

The indicia indicating the unlock and lock operations are arranged on the back housing of the module.

The present invention achieves some advantageous effects. Specifically, by employing a latch to control the moving space of the resilient snapper, the achieved structure is simple, and moreover only upon a toggle operation can the latch be switched between different positions. This ensures that only when the latch is unlocked, can the resilient snapper be operated in a way to enable the module to be taken out of the slot. When the latch is in the lock position, incorrect operations are avoidable. Besides, due to the simplicity and convenience in switching the lock and unlock states manually, there are no special requirements as to the space for operations. As it is possible to reach hands to hold the module, the requirements as to the space for operation and the spacing of the module array are minimized.

MODES FOR CARRYING OUT THE PRESENT INVENTION

Figure 1:
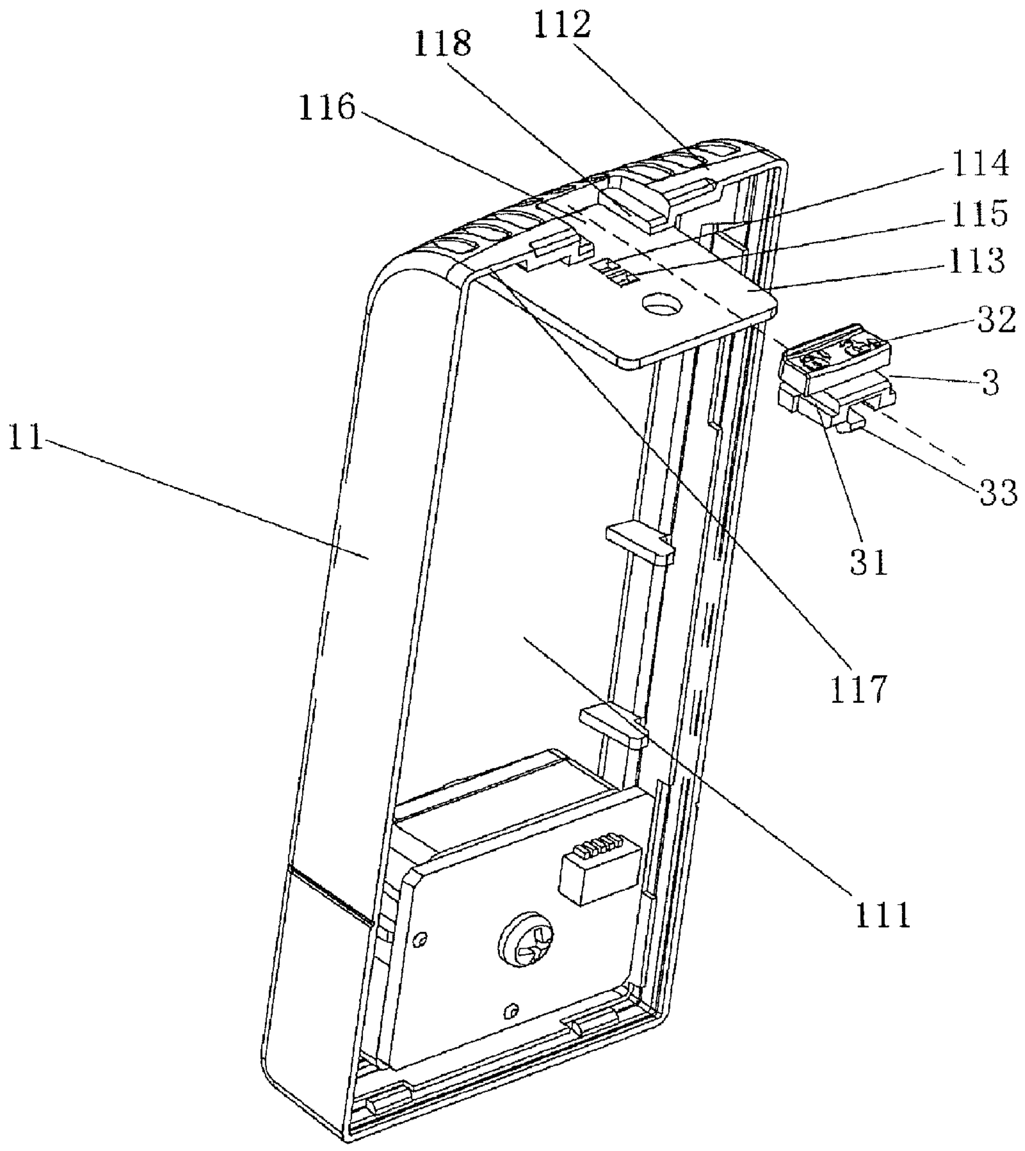
FIG. 1 is a disassembled isometric view of the latch and the front housing of the module according to the present invention.

With reference to FIG. 1 to FIG. 5, the module with fixed structures according to the present invention comprises a module body 1, a resilient snapper 2 and a latch 3. The module body 1 comprises a front housing 11 and a back housing 12 that fit to each other. The latch 3 is arranged on the front housing 11 of the module, while the resilient snapper 2 on the back housing 12 of the module. The latch 3 can slide relative to the module body 1. In this embodiment, the direction in which the latch 3 slides along the guide rail 118 is defined as X-axis direction, the direction parallel to plane of the supporting panel 113 as well as perpendicular to X-axis is defined as Y-axis direction, and the direction perpendicular to both X-axis and Y-axis is defined as Z-axis direction. The axes X, Y and Z together form a rectangular coordinate system, as shown in FIG. 1.

Figure 2:
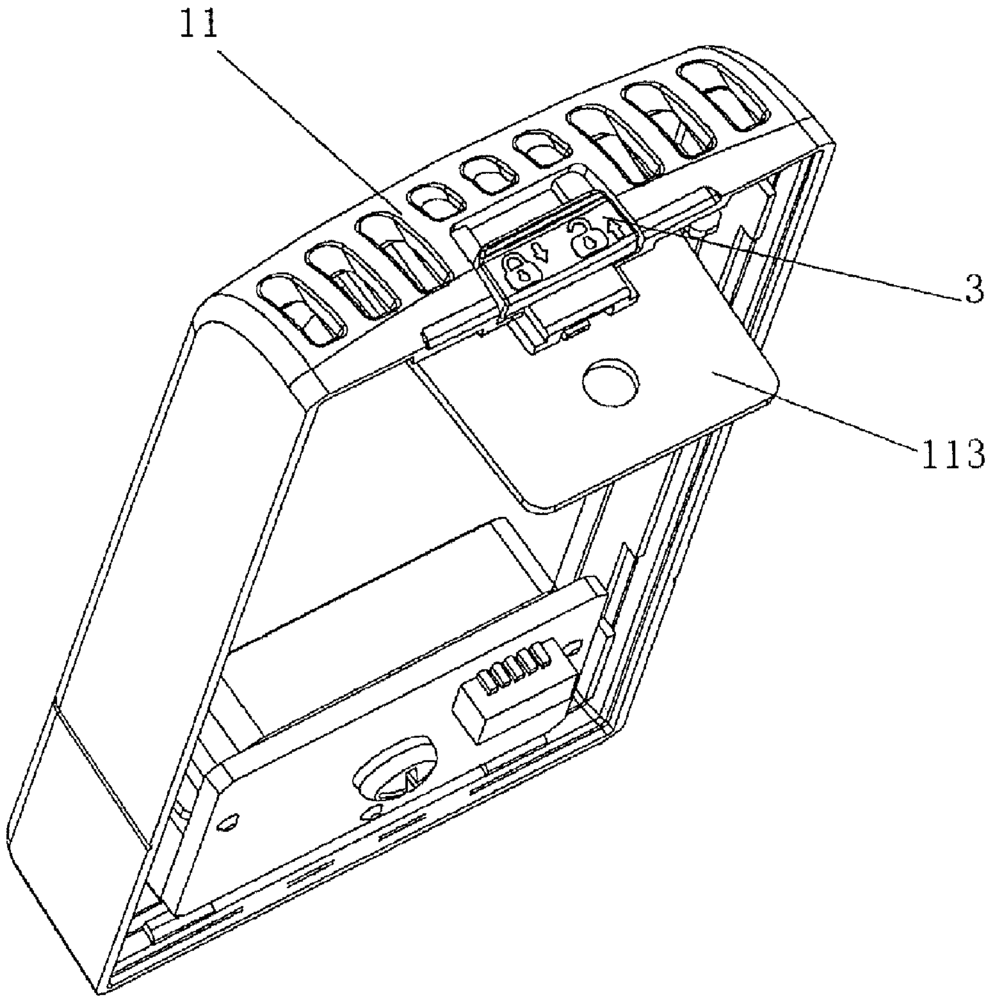
FIG. 2 is an assembled isometric view of the latch and the front housing of the module according to the present invention.
Figure 3:
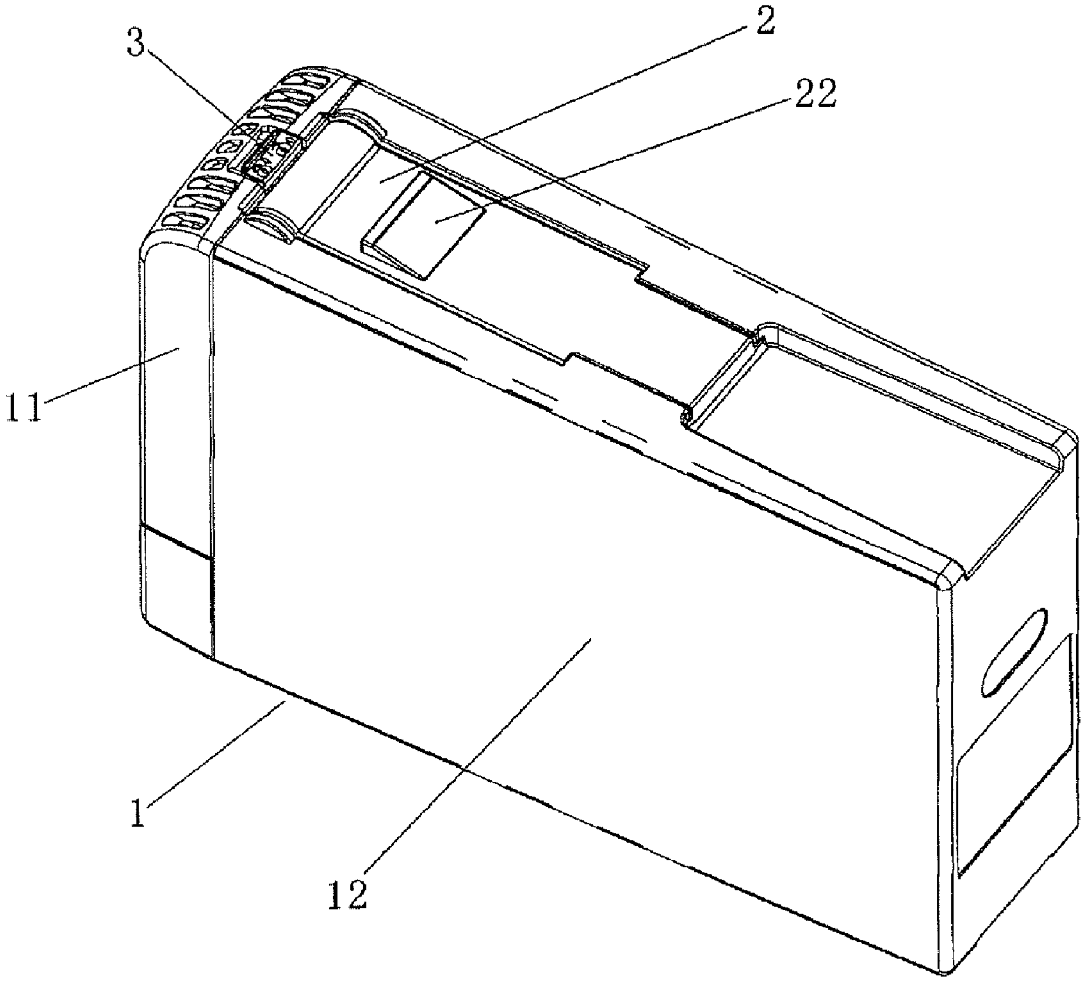
FIG. 3 is an isometric view of the present invention.
Figure 4:
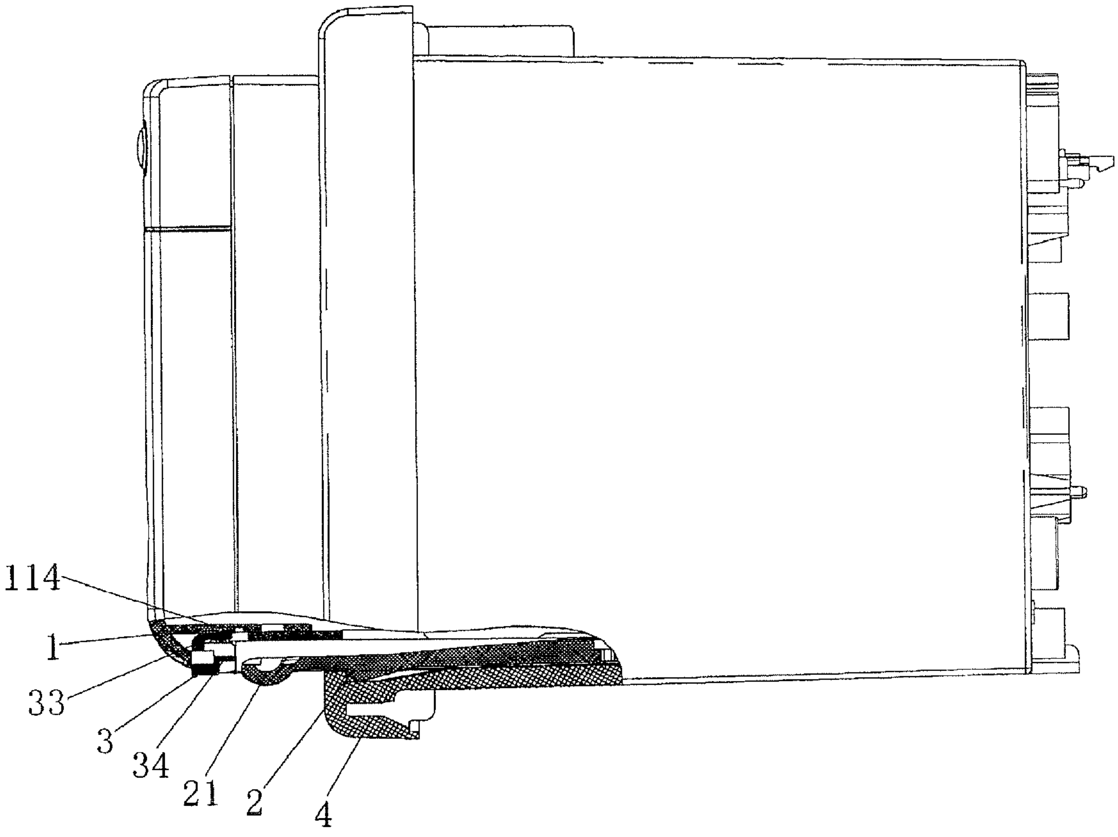
FIG. 4 is a sectional view of the module with fixed structures according to the present invention fitted into the slot, with the latch in the unlock position.
Figure 5:
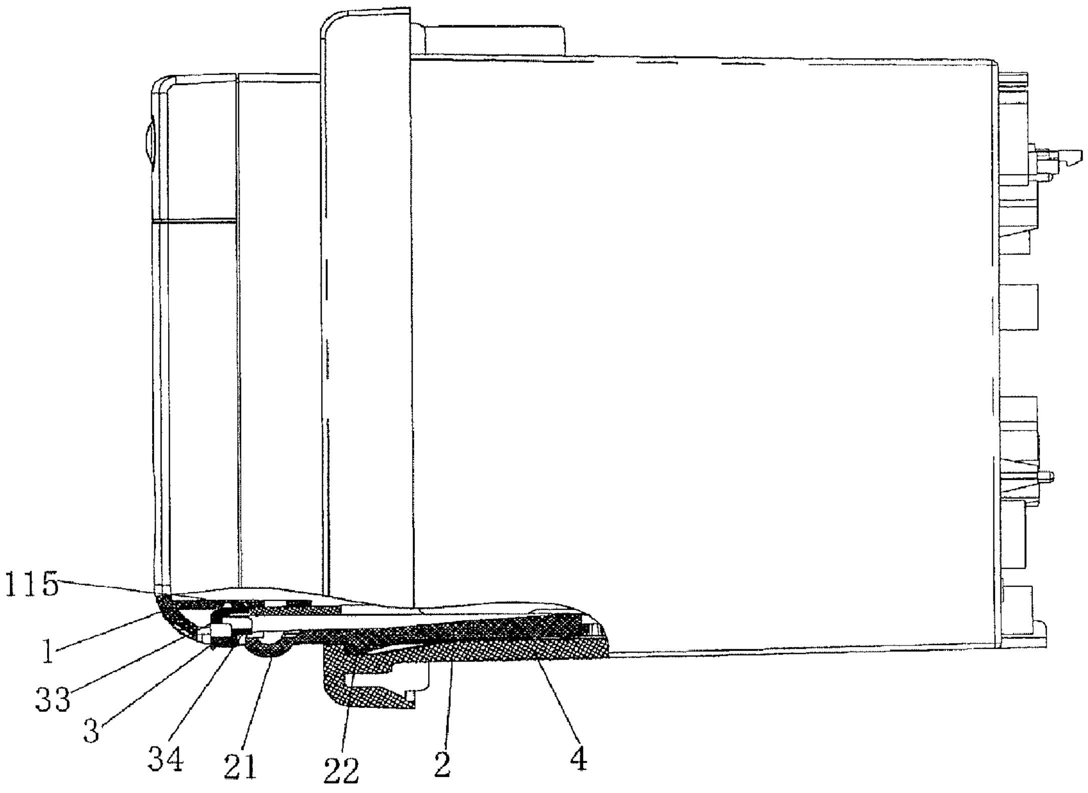
FIG. 5 is a sectional view of the module with fixed structures according to the present invention fitted into the slot, with the latch in the lock position.

The front housing 11 of the module comprises a quadrate base panel 111 and side panels extending vertically from four sides of the rectangular base panel respectively. Arranged on the side panel 112, a mounting notch 116 extends through the side panel 112 along the Z-axis. This mounting notch 116 extends along X-axis up to the surface 117 where the side panel 112 engages with the back housing of the module. Two guide rails 118 project respectively from two walls of the mounting notch 116 parallel to the X-axis, and extend in a direction parallel to the X-axis. Starting from the inner side of the base panel 111, a supporting panel 113 extends along X-axis the same as the side panel 112 does. Meanwhile, a certain distance is left between the supporting panel 113 and the guide rails 118 in Z-axis direction, to make sure that the latch 3 could slide. On the supporting panel 113 there are also provided a first recess 114 and a second recess 115. The back housing 12 of the module can fit the front housing 11. The resilient snapper 2 extends obliquely towards the front housing 11 of the module like a cantilever, and on the exterior side of the resilient snapper 2, a snap-block 22 is set useful for snapping into the slot 4. Of course, the resilient snapper 2 may take the forms other than a cantilever, as long as the resilient snapper 2 could be pushed down resiliently. Two guide grooves 31 are set in the middle of the latch 3 in a manner to respectively correspond to the two guide rails on the front housing 11 of the module, which guide grooves can fit with the guide rails 118, so that the latch 3 can slide along the front housing 11 of the module. In the top surface of the latch 3 there is set an indicia 32 indicating the unlock operation and lock operation. Apparently, those ordinary skilled in the art may understand that the indicia 32 may be positioned wherever the unlock and lock operations are indicated. For example, the indicia may be set in the front housing 11 of the module, or the side panel 112 of the front housing 11 of the module, or corresponding positions on the back housing 12 of the module, etc. In addition, the indicia 32 may be different from those as shown in FIG. 1 and FIG. 2. For example, it may be comprised of arrow only, or the combination of characters "unlock" and "lock" and the arrows, or may be any other different indicia reminding the operators of the corresponding operations. In the bottom of the latch 3 there is a preferably elastic limiter 33 having the functions as hereinafter mentioned. Finally, the latch 3 is further provided with a protrusion 34 extending along the X-axis.

During the process of assembling the module, the latch 3 is pushed into the mounting notch 116 arranged on the front housing of the module, such that the two guide rails 118 on the front housing 11 of the module are respectively inserted into corresponding guide grooves 31 of the latch 3. Therefore, the latch 3 and the front housing 11 of the module form a sliding pair. Next, the back housing 12 of the module is fitted with the front housing 11 of the module, so as to form a complete module 1.

The latch 3 moves between an unlock position and a lock position. When in the unlock position, the latch 3 is retracted into the mounting notch 116, so that the protrusion 34 on the latch 3 does not locate in the downward movement path of the free end 21 of the resilient snapper. As a result, enough spaces are achieved for the downward movement of the free end 21 of the resilient snapper 2. When the resilient snapper 2 is pushed down, the slot 4 is unrestricted from the snap-block 22 of the resilient snapper 22, so that the module 1 could be taken out from the slot 4. When the latch 3 is switched to the lock position (i.e., the latch 3 moves to the lock position along the guide rail), the protrusion 34 on the latch 3 locates in the downward movement path of the free end 21 of the resilient snapper 2, and impedes this downward movement, as a result of which the resilient snapper 2 could not be pushed down. In other words, the slot 4 still engages with the snap-block 22, such that the module 1 can not be taken out of the slot 4. In the unlock position, the elastic limiter 33 of the latch 3 is in the first recess 114 provided on the front housing 11 of the module; in the lock position, the elastic limiter 33 of the latch 3 is in the second recess 115 provided on the front housing 11 of the module.

According to the present invention, the latch 3 and the front housing 11 of the module forms a sliding pair, and there is an unlock position and a lock position for the latch 3. Of course, the latch 3 and the front housing 11 of the module may alternatively form a turning pair, and the latch 3 may moves between an unlock position and a lock position. As a matter of fact, those skilled in the art may understand that the latch 3 may not necessarily slide or turn relative to the module body 1, but could be any other manners which could enable the latch 3 to move between the unlock and lock positions.

The terms "front housing of the module" and "rear housing of the module" should by no means be considered restrictive, and should not be limited to those as shown in the drawings. Apparently, those skilled in the art may appreciate that the mounting positions of the latch 3 and the resilient snapper 2 are interchangeable. Namely, the latch 3 may be arranged on the back housing 12 of the module, while the resilient snapper 2 on the front housing 11 of the module. Such a solution is also feasible.

According to the present invention, the two positions of the latch 3 are reliably set, only upon a toggling operation can they be switched. Therefore, it makes sure that only when the latch 3 is unlocked, can the resilient snapper 2 be operated in a way to take the module 1 out of the slot 4. While the latch 3 is locked, incorrect operations are avoidable, and thus it is unlikely that the module 1 would disengage from the slot 4. It is easy and convenient to switch between the unlock state and the lock state of the latch 3 manually. Due to the possibility of the direct manual operations, there are no special requirements as to the space for operation. Due to the possibility in reaching hands to hold the module, the requirements as to the space for operation and the spacing of the module array are minimized. Besides, as the module is more reliably fixed, the latch could be easily and perfectly integrated with the prior-art modules, and thereby no additional spaces are demanded.

The above-mentioned is described in details in connection with the preferred embodiments of the present invention. However, those embodiments should by no means be regarded as a limitation to the scope of the present invention. Those ordinarily skilled in the art may understand that other derivations and substitutions are possible without deviating from the spirit of the present invention, which should also be considered as in the scope of the present invention defined by the appended claims.

What is claimed is:

1. A module with fixed structures, comprising a module body and a resilient snapper arranged on the module body, wherein a latch is further provided, which is movably connected with the module body, on which body a stop surface is provided for stopping the latch from disengagement, and the latch can move between a lock position and an unlock position, when in the lock position, the latch is at least partly in the downward movement path of the free end of the resilient snapper; and when in the unlock position, the latch is out of the downward movement path of the free end of the resilient snapper.

2. The module with fixed structures according to claim 1, wherein the latch and the module body form a sliding pair, the module body provided with a guide rail, and the latch provided with a guide groove; the guide rail can be inserted into the corresponding guide groove, and the stop surface is the bottom surface where the guide rail engages with the guide groove, useful for preventing the latch from disengaging with the module body.

3. The module with fixed structures according to claim 1 or 2, wherein the latch is provided with a limiter, and the module body is provided with a first recess and a second recess which define the unlock position and the lock position respectively, the recesses are in the motion path of the limiter.

4. The module with fixed structures according to claim 1, wherein an indicia indicating the unlock and lock operations are set on the latch.

5. The module with fixed structures according to claim 1, comprising a front housing and a back housing which fit to each other, wherein the latch is provided on the front housing of the module, and the resilient snapper is provided on the back housing of the module.

6. The module with fixed structures according to claim 5, wherein a mounting notch is provided on the front housing of the module with two parallel guide rails extending therefrom, and a supporting panel is set beneath the guide rails.

7. The module with fixed structures according to claim 6, wherein guide grooves are so provided on the latch that they respectively correspond to the two guide rails arranged on the front housing of the module, which guide rails can be inserted into the corresponding guide grooves.

8. The module with fixed structures according to claim 6, wherein in either the lock position or the unlock position, the latch engages with the surface of the supporting panel facing the latch.

9. The module with fixed structures according to claim 5, wherein the indicia indicating the unlock and lock operations are arranged on the front housing of the module.

10. The module with fixed structures according to claim 5, wherein the indicia indicating the unlock and lock operations are arranged on the back housing of the module.

11. The module with fixed structures according to claim 1, wherein the resilient snapper is arranged on the module body like a cantilever.

12. The module with fixed structures according to claim 1, wherein the latch is movably connected with the module body, forming a turning pair therewith, and can move between the lock position and the unlock position.

13. A module with fixed structures, comprising a module body and a resilient snapper arranged on the module body, wherein a latch is further provided, which is movably connected with the module body, on which body a stop surface is provided for stopping the latch from disengagement, and the latch can move between a lock position and an unlock position, when in the lock position, the latch is at least partly in the downward movement path of the free end of the resilient snapper; and when in the unlock position, the latch is out of the downward movement path of the free end of the resilient snapper; and wherein the latch is provided with a limiter, and the module body is provided with a first recess and a second recess which define the unlock position and the lock position respectively, the recesses are in the motion path of the limiter.

14. A module with fixed structures, comprising a module body and a resilient snapper arranged on the module body, wherein a latch is further provided, which is movably connected with the module body, on which body a stop surface is provided for stopping the latch from disengagement, and the latch can move between a lock position and an unlock position, when in the lock position, the latch is at least partly in the downward movement path of the free end of the resilient snapper and impedes further downward movement of the free end of the resilient snapper; and when in the unlock position, the latch is out of the downward movement path of the free end of the resilient snapper, and the free end of the resilient snapper is downwardly moveable into a moving space, the moving space at least partially occupied by the latch in the lock position.

* * * * *